United States Patent
Hu (10) Patent No.: US 10,559,258 B2
(45) Date of Patent: Feb. 11, 2020

(54) PIXEL CIRCUIT AND DRIVING METHOD, ARRAY SUBSTRATE, AND DISPLAY APPARATUS

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventor: Zuquan Hu, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei (CN)

( * ) Notice: Subject to any disclaimer, the term of this patent is extended or adjusted under 35 U.S.C. 154(b) by 282 days.

(21) Appl. No.: 15/757,846

(22) PCT Filed: Aug. 14, 2015

(86) PCT No.: PCT/CN2015/087023
§ 371 (c)(1),
(2) Date: Mar. 7, 2018

(87) PCT Pub. No.: WO2016/090945
PCT Pub. Date: Jun. 16, 2016

(65) Prior Publication Data
US 2018/0233087 A1 Aug. 16, 2018

(30) Foreign Application Priority Data

Dec. 10, 2014 (CN) .......................... 2014 1 0757772

(51) Int. Cl.
G09G 3/3258 (2016.01)
G09G 3/3291 (2016.01)
H01L 27/32 (2006.01)

(52) U.S. Cl.
CPC ......... *G09G 3/3258* (2013.01); *G09G 3/3291* (2013.01); *H01L 27/323* (2013.01);
(Continued)

(58) Field of Classification Search
CPC ...... G06F 3/0412; G06F 3/0416; G06F 3/042; G06F 3/044; G09G 2300/0852;
(Continued)

(56) References Cited

U.S. PATENT DOCUMENTS

| 2010/0066703 A1 | 3/2010 | Chen et al. |
| 2011/0001711 A1 | 1/2011 | Choi et al. |

(Continued)

FOREIGN PATENT DOCUMENTS

| CN | 101943974 A | 1/2011 |
| CN | 103208255 A | 7/2013 |

(Continued)

OTHER PUBLICATIONS

International Search Report dated Aug. 14, 2015, issued in counterpart International Application No. PCT/CN2015/087023 (14 pages).

*Primary Examiner* — Hong Zhou
(74) *Attorney, Agent, or Firm* — Westerman, Hattori, Daniels & Adrian, LLP (57) ABSTRACT

A pixel circuit is provided. The pixel circuit includes a driving transistor (TP) and a touch module (2) configured to cause a voltage change when a touch operation happens and coupled to a data line through a writing compensation module (1), wherein the writing compensation module (1) includes a storage capacitor (C1), is configured to compensate a threshold voltage of the driving transistor (TP), and to allow the voltage change to be read out through the data line.

18 Claims, 4 Drawing Sheets

(52) U.S. Cl.
CPC .............. *G09G 2300/0809* (2013.01); *G09G 2310/0264* (2013.01); *G09G 2360/14* (2013.01)

(58) Field of Classification Search
CPC ......... G09G 2310/0262; G09G 3/3233; G09G 3/3258; G09G 2360/14; G09G 2300/0809; G09G 3/3291; H01L 27/323
See application file for complete search history.

(56) References Cited

U.S. PATENT DOCUMENTS

| | | | |
|---|---|---|---|
| 2012/0061556 A1* | 3/2012 | Chan | G09G 3/3233 250/214 R |
| 2014/0055325 A1* | 2/2014 | Qi | G09G 3/3233 345/76 |
| 2014/0306867 A1 | 10/2014 | Qing et al. | |
| 2015/0002414 A1* | 1/2015 | Tan | G06F 3/0412 345/173 |
| 2015/0103037 A1* | 4/2015 | Wu | G09G 3/3233 345/174 |
| 2015/0193045 A1* | 7/2015 | Zhou | G09G 3/3233 345/174 |
| 2015/0221255 A1 | 8/2015 | Qing et al. | |
| 2015/0302801 A1* | 10/2015 | Tan | G06F 3/042 345/173 |

FOREIGN PATENT DOCUMENTS

| | | | | |
|---|---|---|---|---|
| CN | 103218972 A | | 7/2013 | |
| CN | 103310728 A | | 9/2013 | |
| CN | 103354078 A | * 10/2013 | | ............... G09G 3/32 |
| CN | 103354079 A | * 10/2013 | | ............... G09G 3/32 |
| CN | 104464625 A | | 3/2015 | |
| CN | 204242563 U | | 4/2015 | |

\* cited by examiner

PIXEL CIRCUIT AND DRIVING METHOD, ARRAY SUBSTRATE, AND DISPLAY APPARATUS

CROSS-REFERENCES TO RELATED APPLICATIONS

This PCT application claims priority of Chinese Patent Application No. 201410757772.X, filed on Dec. 10, 2014, the entire contents of which are incorporated by reference herein.

FIELD OF THE INVENTION

The present invention generally relates to the field of display technologies and, more particularly, to pixel circuit and driving methods, and related array substrates, and display apparatus.

BACKGROUND

Active Matrix Organic Light-emitting Diode (AMOLED) display is one of the most-researched topics in the field of flat panel display. Comparing with Thin Film Transistor-Liquid crystal display (TFT-LCD), AMOLED display has the advantages of lower power consumption, lower production cost, self-emission, faster response, and wider viewing-angle, etc. Currently, AMOLED display is substituting for the conventional LCD display of cell phones, PDAs, and digital cameras, etc. Pixel driving circuit design is a core technology of AMOLED display; and is an important research field.

Currently, In-cell touch technology has been successfully applied to the LCD display panels; and mass production has been achieved by some providers in the industry. However, due to certain limitations, In-cell touch technology is still unable to replace products based on Add-on and One Glass solution (OGS) in large scales. However, according to the present disclosure, if the In-cell technology can be integrated with the AMOLED technology, i.e., integrating the In-cell touch fabrication process with the AMOLED fabrication process, the majority of the display market may be benefited because of the integration of the two most-advanced technologies. The disclosed circuit, methods and apparatus are directed to solve one or more problems set forth above and other problems.

BRIEF SUMMARY OF THE DISCLOSURE

The present disclosure is to at least partially solve one or more the above described technology issues existing in the AMOLED display by providing a pixel circuit integrating a touch function and a threshold voltage compensation function and a driving method thereof, an array substrate, and a display apparatus.

One technical approach to solve the technical issues of the present disclosure is a pixel circuit integrating a touch function and a threshold voltage compensation function. The pixel circuit includes a driving transistor; and a touch module configured to cause a voltage change when a touch operation happens and coupled to a data line through a writing compensation module, wherein the writing compensation module includes a storage capacitor, is configured to compensate a threshold voltage of the driving transistor, and to allow the voltage change to be read out through the data line.

Optionally, the writing compensation module further includes a pulling-up sub-module for pulling up the voltage of a first terminal of the storage capacitor; a pulling-down sub-module for pulling down the voltage of a second terminal of the storage capacitor; and a connecting sub-module for allowing the voltage of the first terminal of the storage capacitor to be applied to the control gate of the driving transistor.

Optionally, the pulling-up sub-module includes a pulling-up switch transistor; a first terminal of the pulling-up switch transistor is connected to a pulling-up voltage source; a second terminal of the pulling-up switch transistor is connected to the first terminal of the storage capacitor; and a control gate terminal of the pulling-up switch transistor is connected to a pulling-up control line.

Optionally, the pulling-down sub-module includes a pulling-down switch transistor; a first terminal of the pulling-up switch transistor is connected to a pulling-down voltage source; a second terminal of the pulling-down switch transistor is connected to the second terminal of the storage capacitor; and a control gate terminal of the pulling-down switch transistor is connected to a pulling-down control line.

Optionally, the driving transistor further includes a first terminal being connected to a driving voltage source for driving the light emitting module.

Optionally, the touch module includes a touch sensing element and a touch switch transistor; and the touch switch transistor includes a first terminal being connected to the first terminal of the storage capacitor, a second terminal being connected to a first terminal of the touch sensing element, and a control gate terminal being connected to a touch sensing control line.

Optionally, the touch sensing element is a variable capacitor; and a second terminal of the variable capacitor is floating.

Optionally, the touch sensing element is a photosensitive diode; and a first terminal of the photosensitive diode is connected to a terminal with low potential.

Optionally, the pixel circuit further includes a first data connecting switch transistor; and the data connecting switch transistor includes a first terminal being connected to the data line, a second terminal being connected to the control gate terminal of the driving transistor, and a control gate terminal being connected to a first data connecting control line.

Optionally, the pixel circuit further includes a light-emitting module comprising a light emitting switch transistor and an organic light-emitting diode as a pixel of the pixel circuit; the light-emitting switch transistor includes a first terminal being connected to a second terminal of the driving transistor, a second terminal being connected to a first terminal of the organic light-emitting diode, and a control gate terminal being connected to a light emitting control line; and a second terminal of the organic light-emitting diode is connected to a pulling-down voltage source.

Another technical approach to solve the technical issue of the present disclosure is a pixel circuit driving method. The pixel circuit drive method includes implementing an initialization stage; implementing a touch sensing stage; implementing a touch sensing readout stage; implementing a resetting stage; implementing a writing compensation stage; and implementing a light emitting stage.

Optionally, implementing the initialization stage includes charging the storage capacitor to make voltage of a first terminal of the storage capacitor be equal to a pulling-up voltage, and voltage of a second terminal of the storage capacitor be equal to a pulling-down voltage.

Optionally, implementing the touch sensing readout stage includes changing voltage on a first terminal of the storage capacitor by the touch module when the touch operation happens.

Optionally, implementing the resetting stage includes reading voltage on a first terminal of the storage capacitor by the data line.

Optionally, wherein implementing the writing compensation stage includes charging the storage capacitor to make voltage of a first terminal of the storage capacitor be equal to a pulling-up voltage, and voltage of a second terminal of the storage capacitor be equal to a pulling-down voltage.

Optionally, implementing the writing compensation stage includes writing a data voltage into the data line; writing the data voltage into the control gate of the driving transistor to turn on the driving transistor; and charging the storage capacitor until the voltage of a second terminal of the storage capacitor is equal to a deviation between the data voltage and the threshold voltage of the control gate of the driving transistor.

Optionally, implementing the light emitting stage includes emitting lights through the light emitting module driven by the driving transistor without disturbance of the threshold voltage. V3

Another technical approach to solve the technical issue of the present disclosure is an array substrate. The array substrate includes the disclosed pixel circuit.

Another technical approach to solve the technical issue of the present disclosure is a display apparatus. The display apparatus includes the disclosed array substrate.

The present disclosure may have various beneficial effects. For example, the disclosed pixel drive circuit integrates the writing compensation module configured to compensate the threshold voltage of the driving transistor with the touch module configured to achieve the touch function of the pixel circuit, less number of transistors and capacitors are needed. Thus, the fabrication steps for manufacturing the touch products may be reduced; the production cost may be reduced; and the production efficiency may be improved. Further, having the threshold compensation function enhances the display quality of AMOLED display.

Further, the timing sequence of the disclosed pixel circuit driving method is simple; and it may be easy to implement. As the disclosed array substrate includes the disclose pixel circuit, the performance of the disclosed array substrate is as desired; and the practicality is improved. Further, the disclosed display apparatus includes the disclosed array substrate. Thus, the display quality is enhanced.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings.

For illustrative purposes, the transistors described in the embodiments of the present invention may be thin-film transistors (TFTs), field-effect transistors, or other devices having similar electrical characteristics of transistors. The source and the drain of a transistor may be symmetrical. Thus, there may be no difference between the source and the drain of the transistor. In order to discriminate the source and the drain of the transistor, when one of the source and the drain of the transistor is referred as a first terminal, the other may be referred as a second terminal. The gate of the transistor may be referred as a control gate. Further, the transistors may be P-type transistors, or N-type transistors, according to the characteristics of the transistors. For illustrative purposes, in one embodiment, N-type TFT transistors (dependent mode TFT) are used in the description; and the first terminal of an N-type transistor is the source; and the second terminal of the N-type transistor is the drain. In certain other embodiments, P-type transistors may be used.

Figure 1:
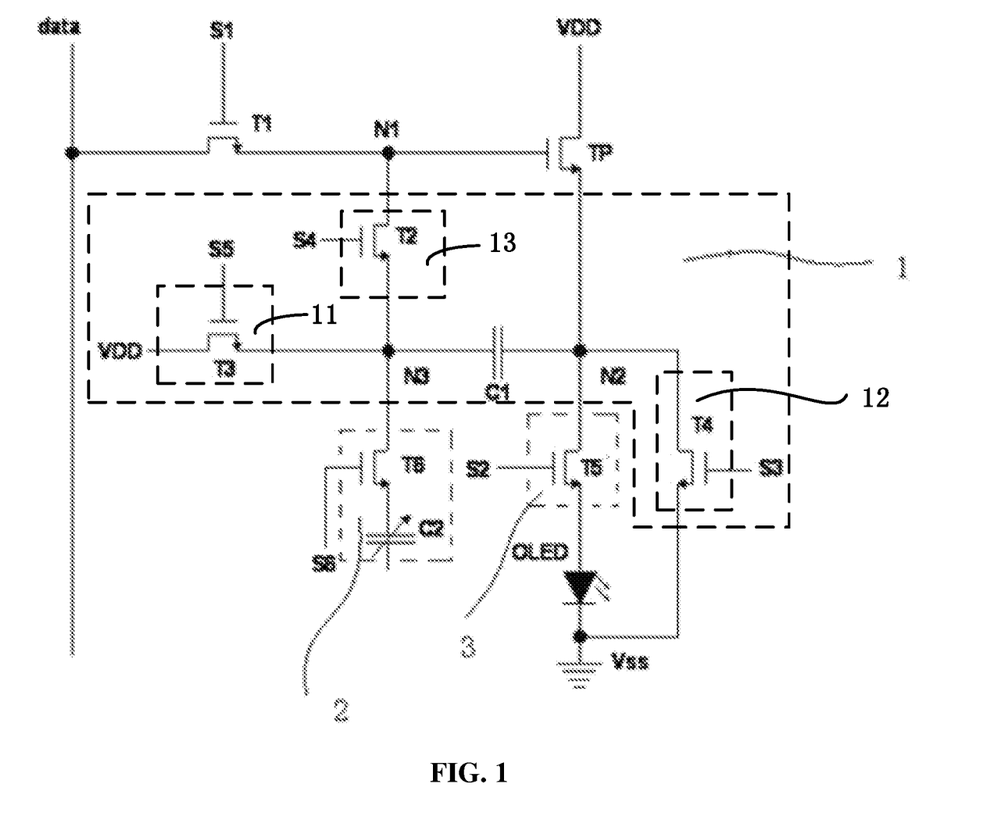
FIG. 1 illustrates a circuit diagram of an exemplary pixel circuit according to the disclosed embodiments.

FIG. 1 illustrates a circuit diagram of an exemplary pixel circuit according to the disclosed embodiments. As shown in FIG. 1, the pixel circuit may include a switch transistor T1, a driving transistor TP, a storage capacitor C1, an organic light-emitting diode (OLED), a writing compensation module 1, a touch module 2, and a light emitting module 3.

The writing compensation module 1 may include a pulling-up sub-module 11 for pulling up the voltage of a first terminal of the storage capacitor C1; a pulling-down sub-module 12 for pulling down the voltage of a second terminal of the storage capacitor C1; a connecting sub-module 13 for allowing the voltage of the first terminal of the storage capacitor C1 to be applied to the control gate of the driving transistor TP.

The pulling-up sub-module 11 may include a pulling-up switch transistor referred as a third switch transistor T3. The pulling-down sub-module 12 may include a pulling-down switch transistor referred as a fourth switch transistor T4. The connecting sub-module 13 may include a second switch transistor T2.

A first terminal of the data-connecting transistor referred as a first switch transistor T1 may be connected or coupled to a data line "data". A second terminal of the first switch transistor T1 may be connected to a first node "N1". A control gate of the first switch transistor T1 may be connected to a data connecting control line referred as a first control line "S1".

A first terminal of the driving transistor TP may be connected to a driving voltage source being equal to VDD. A second terminal of the driving transistor TP may be connected to a second node "N2". The control gate of the driving transistor TP may be connected to the first node "N1".

A first terminal of the storage capacitor C1 may be connected to a third node "N3". A second terminal of the storage capacitor C1 may be connected to the second node "N2". That is, the storage capacitor C1 may be connected between the second node "N2" and the third node "N3".

Further, the writing compensation module 1 may be connected to the first node "N1", the second node "N2", the third node "N3", a pulling-down control line referred as a third control line S3, a fourth control line S4 for control the second transistor T2, a pulling-up control line referred as a fifth control line S5, a pulling-up voltage source being equal to VDD, and a second terminal of the OLED. The touch module 2 may be connected to the third node "N3", and a touch sensing control line referred as a sixth control line S6.

The writing compensation module 1 may be configured to write the input voltage from the data line "data" into the driving transistor TP; and compensate a threshold voltage "Vth" of the control gate of the driving transistor TP, when control signals are applied on the first control line S1 and the fifth control line S5.

The touch module 2 may be configured to change the voltage at the third node "N3" when a control signal is applied on the sixth control line S6. Further, the touch module 2 may also be used to read the voltage change at the third node "N3" through the data line "data" when control signals are applied on the first control line S1 and the fourth control line S4.

The light emitting control module 3 may be connected to a light-emitting control line referred as a second control line S2, the second node "N2", and a first terminal of the OLED. The second terminal of the OLED may be connected with a third voltage that is equal to Vss. The light emitting control module 3 may be used to turn on the OLED when a control signal is applied on the second control line S2.

In the disclosed embodiments, the writing compensation module 1 configured to compensate the threshold voltage "Vth" of the driving transistor TP may be integrated with the touch module 2 configured to achieve the touch function of the pixel drive circuit. Such an integration may simplify the process for manufacturing the touch control display products; and lower the production cost; and increase the production efficiency. Further, because the integrated pixel driving circuit also has the function to compensate the threshold voltage "Vth" of the driving transistor TP, the display quality of the AMOLED display panel may be enhanced.

Further, referring to FIG. 1, the writing compensation module 1 may include a second switch transistor T2, a third switch transistor T3, and a fourth switch transistor T4. The first terminal of the second switch transistor T2 may be connected to the first node "N1". The second terminal of the second switch transistor T2 may be connected to the third node "N3". The control gate of the second switch transistor T2 may be connected to the fourth control line S4. That is, the second switch transistor T2 may be connected between the first node "N1" and the third node "N3", and the fourth control line S4 may control the connection between the first node "N1" and the third node "N3".

Further, referring to FIG. 1, the first terminal of the third switch transistor T3 may be connected to the second voltage that is equal to VDD. The second terminal of the third switch transistor T3 may be connected to the third node "N3". The control gate of the third switch transistor T3 may be connected to the fifth control line S5. That is, the fifth control line S5 may control or switch on/off the second voltage VDD to the third node "N3".

Further, referring to FIG. 1, the first terminal of the fourth switch transistor T4 may be connected to the second node "N2". The second terminal of the fourth switch transistor T4 may be connected to the second terminal of the OLED and the third voltage VSS. The control gate of the fourth switch transistor T4 may be connected with the third control line S3. That is, the fourth switch transistor T4 may be connected between the second node "N2" and the third voltage Vss, and the third control line S3 may control or switch on/off the third voltage Vss to the second node "N2".

Further, referring to FIG. 1, the first light emitting control module 3 may include a fifth transistor T5. The first terminal of the fifth transistor T5 may be connected to the second node "N2". The second terminal of the fifth transistor T5 may be connected to the first terminal of the OLED. The control gate of the fifth transistor T5 may be connected to the second control line S2. That is, the fifth transistor T5 may be connected between the second node "N2" and the OLED, and the second control line S2 may control the connection between the second node "N2" and the OLED.

Further, referring to FIG. 1, the touch module 2 may include a touch sensing transistor referred as a sixth switch transistor T6 and a variable capacitor C2. The first terminal of the sixth switch transistor T6 may be connected to the third node "N3". The second terminal of the sixth switch transistor T6 may be connected to the first terminal of the variable capacitor C2. The control gate of the sixth switch transistor T6 may be connected to the sixth control line S6. That is, the sixth transistor T6 may be connected between the third node "N3" and the variable capacitor C2, and the sixth control line S6 may control the connection between the third node "N3" and the variable capacitor C2. The second terminal of the variable capacitor C2 may be floating or in similar configuration.

Figure 2:
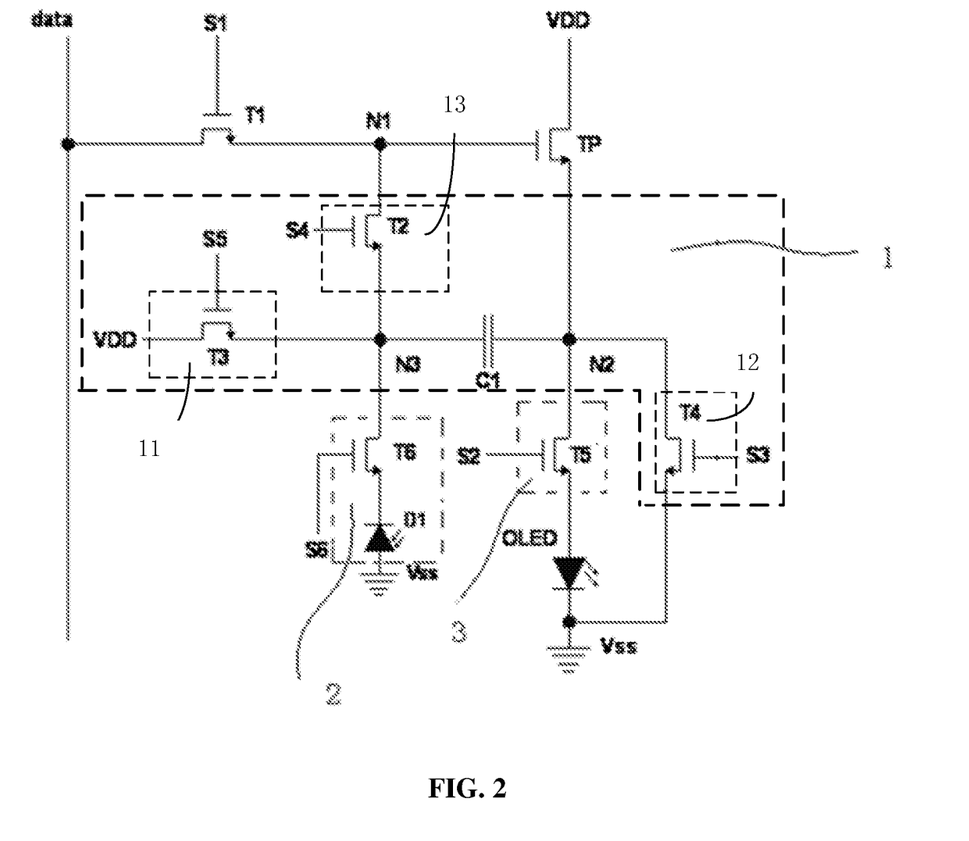
FIG. 2 illustrates a circuit diagram of another exemplary pixel circuit according to the disclosed embodiments.

FIG. 2 illustrates a circuit diagram of another exemplary pixel circuit according to disclosed embodiments. The pixel circuit illustrated in FIG. 2 may be similar to the pixel circuit illustrated in FIG. 2. The difference may include that, the touch module 2 illustrated in FIG. 2 may include the sixth switch transistor T6 and a photosensitive diode D1, instead of the variable capacitor C2 illustrated in FIG. 1. The first terminal of the sixth switch transistor T6 may be connected to the third node "N3". The second terminal of the sixth switch transistor T6 may be connected to the second terminal of the photosensitive diode D1. The control gate of the sixth switch transistor T6 may be connected to the sixth control line S6. That is, the sixth switch transistor T6 may be connected between the third node "N3" and the photosensitive diode D1, and the sixth control line S6 may control the connection between the third node "N3" and the photosensitive diode D1. The first terminal of the photosensitive diode D1 may be connected with the third voltage Vss.

In operation, the pixel circuit may be driven by various signals, and a pixel circuit driving method is provided. The pixel circuit driving method may include following stages: an initialization stage, a touch sensing stage, a touch sensing readout stage, a resetting stage, a writing compensation stage, and a light emitting stage. Certain stages may be omitted and other stages may be added.

During the initialization stage, e.g., referring to FIG. 1, switch on control signals may be applied on the first control line S1, the third control line S3, and the fifth control line S5. That is, the first switch transistor T1 is switched on, and the data is thus provided on the first node "N1". The fourth switch transistor T4 is also switched on, and the voltage VDD is provided on the third node "N3." The storage capacitor C1 may be charged, as the writing compensation module 1 causes the voltage at the third node "N3" to be the second voltage VDD. Further, the third switch transistor T3 is switched on to cause the voltage on the second node "N2" to be the third voltage Vss.

During the touch sensing stage, e.g., referring to FIG. 1, switch on control signals may be applied on the third control line S3 and the sixth control line S6. That is, the fourth transistor T4 is switched on; and the third voltage Vss is thus provided on the second node "N2". The sixth switch transistor T6 is also switched on, and the first terminal of the variable capacitor C2 is connected to the second node "N2". When a touch operation occurs, the touch module 2 may change to cause the voltage on the third node "N3" to change. That is, charges stored in the storage capacitor C1 may be changed.

During the touch sensing readout stage, e.g., referring to FIG. 1, switch on control signals may be applied on the first control line S1, the third control line S3 and the fourth control line S4. That is, the first switch transistor T1 is switched on; the second switch transistor T2 is switched on; and the fourth transistor T4 is switched on. The data line "data" may be connected to the third node "N3", and the voltage on the third node "N3" may be read through the data line "data".

During the resetting stage, e.g., referring to FIG. 1, switch on control signals may be applied on the first control line S1, the third control line S3 and the fifth control line S5. That is, the first switch transistor T1 is switched on; the third switch transistor T3 is switched on; and the fourth switch transistor T4 is switched on. Thus, the second voltage VDD is provided on the third node "N3"; and the third voltage Vss is provided on the second node "N2". The storage capacitor C1 may be charged through the writing compensation module 1 to cause the voltage on the third node "N3" to be the second voltage VDD and the voltage on the second node "N2" to be the third voltage Vss.

During the writing compensation stage, e.g., referring to FIG. 1, switch on control signals may be applied on the first control line S1 and the fifth control lien S5. That is, the first switch transistor T1 is switched on; and the third switch transistor T3 is switched on. The data voltage "Vdata" is provided on the first node "N1". The data voltage "Vdata" may be written into the control gate of the driving transistor TP to turn on the driving transistor TP. At the same time, the first terminal of the driving transistor TP may be charged through the writing compensation module 1 until the voltage of the first terminal is equal to a deviation between the data voltage "Vdata" and the threshold voltage "Vth" of the control gate of the driving transistor TP.

During the light emitting stage, e.g., referring to FIG. 1, switch on control signals may be applied on the second control line S2 and the fourth control line S4. That is, the fifth switch transistor T5 is switched on; and the second switch transistor T2 is switched on. Thus, the OLED may be turned on.

Figure 3:
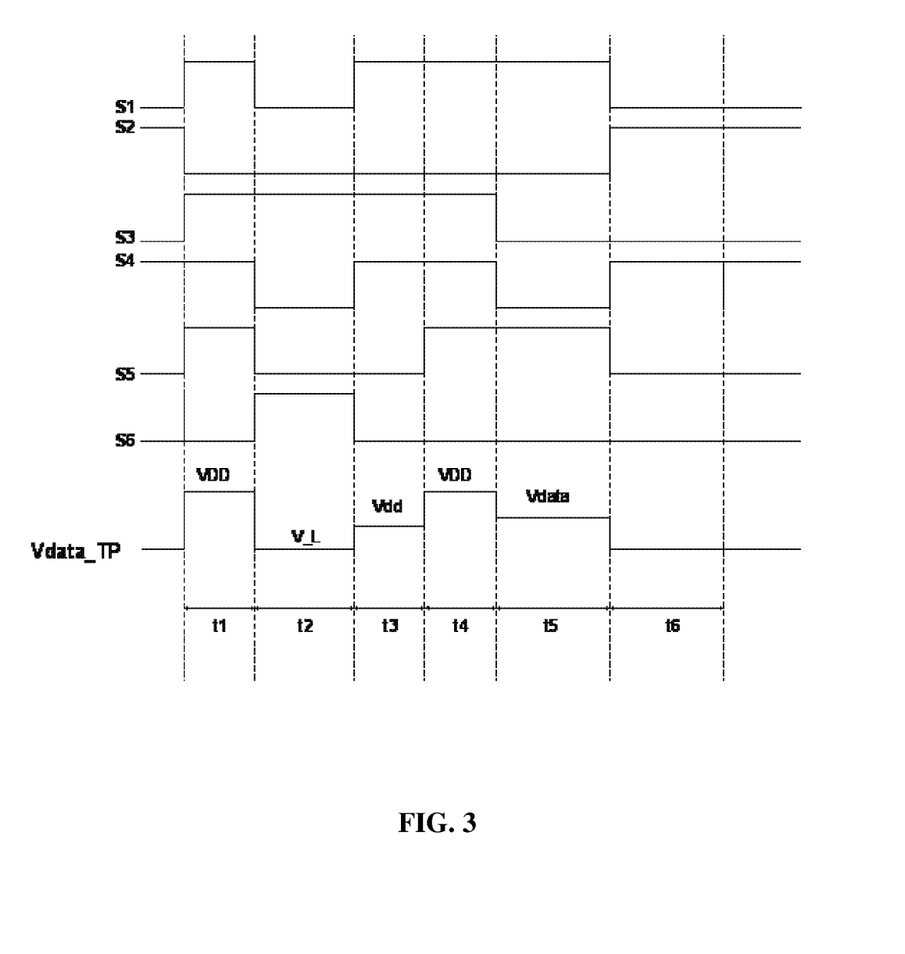
FIG. 3 illustrates a timing sequence of a an exemplary pixel circuit according to the disclosed embodiments.

FIG. 3 illustrates a timing sequence of the driving method of the exemplary pixel circuit according to the disclosed embodiments. Specifically, the pixel circuit driving method may be explained in detail according to FIG. 1 and FIG. 3.

As shown in FIG. 3, during the "t1" time slot (corresponding to the initialization stage), switch on signals are applied on the first control line S1, the third control line S3, the fourth control line S4 and the fifth control line S5. Thus, the first switch transistor T1, the second switch transistor T2, the third switch transistor T3, and the fourth switch transistor T4 are switched on. At the same time, close signals may be applied on the second control line S2 and the sixth switch transistor S6. Thus, the fifth switch transistor T5 and the sixth switch transistor T6 may be switched off. The OLED may be switch off; and is not turned on to emit light.

The storage capacitor C1 is charged. At this time, the first terminal of the third switch transistor T3 may be connected to the second voltage VDD; and the second terminal of the fourth switch transistor T4 may be connected to the third voltage Vss. Thus, the voltage on the third node "N3" may be pulled-up as the second voltage VDD. That is, the voltage on the third node is: V_N3=VDD. Because the second terminal of the fourth switch transistor T4 may be connected to the third voltage Vss, and the first terminal of the fourth transistor T4 may be connected to the second node "N2", the voltage on the second node "N2" may be the same as the third voltage Vss. That is, the voltage on the second node "N2" may be: V_N2=Vss. The voltage on the third node "N3" and the voltage on the second node "N2" may be the voltage applied on both terminals of the storage capacitor C1.

As shown in FIG. 3, during the "t2" time slot (corresponding to the touch sensing stage), switch on control signals may be applied on the third control line S3 and the sixth control line S6. Thus, the fourth switch transistor T4 and the sixth switch transistor T6 may be switched on. At the same time, close control signals may be applied on the first control line S1, the second control line S2, the fourth control line S4 and the fifth control line S5. Thus, the first switch transistor T1, the second switch transistor T2, the third switch transistor T3 and the fifth switch transistor T5 may be switched off. Under this condition, when a touch operation occurs, the capacitance of the variable capacitor C2 may change. The capacitance change on the variable capacitor C2 may cause the voltage on the third node "N3" to change. Thus, the charges stored in the storage capacitor C1 may change.

As shown in FIG. 3, during the "t3" time slot (corresponding to the touch sensing readout stage), switch on control signals may be applied on the first control line S1, the third control line S3 and the fourth control line S4. Thus, the first switch transistor T1, the second switch transistor T2 and the fourth switch transistor T4 may be switched on. Thus, the data line "data" is connected to the first node "N1", and the third node "N3". Thus, the data line "data" connecting with the first terminal of the first switch transistor T4 may be configured as a detection signal line of the touch operation; and the storage capacitor C1 may discharge to the detection signal line. When the above-described touch operation occurs, the charges stored in the storage capacitor C1 is different from the originally stored charges, i.e., without being discharged by the touch operation. Thus, according to the charges detected by the detection signal line, the occurrence of the touch operation may be determined.

As shown in FIG. 3, during the "t4" time slot (corresponding to the resetting stage, similar as the initialization stage), switch on control signals may be applied on the first control line S1, the third control line S3, the fourth control line S4 and the fifth control line S5. Thus, the first switch transistor T1, the second switch transistor T2, and the fourth transistor T4 may be switched on. At the same time, close control signals may be applied on the second control line S2 and the sixth control line S6. Thus, the fifth switch transistor T5 and the sixth switch transistor T6 may be switched off. The OLED may be open-circuited. Thus, the OLED is still off. Because the first terminal of the third transistor T3 may be connected to the second voltage VDD; and the second terminal of the third transistor T3 may be connected to the third node "N3", the second voltage VDD may be pulled-up as the voltage on the third node "N3". That is, the voltage on the third node "N3": V_N3=VDD. Further, because the second terminal of the fourth transistor T4 may be connected to the third voltage Vss, and the first terminal of the fourth transistor T4 may be connected to the second node "N2", the voltage on the second node "N2" may be the second voltage Vss. That is, V_N2=Vss.

As shown in FIG. 3, during the "t5" time slot (corresponding to the writing compensation stage), switch on control signals may be applied on the first control line S1 and the fifth control line S5. Thus, the first switch transistor T1 and the third switch transistor T3 may be switched on. Close control signals may be applied on the second control line S2, the third control line S3, the fourth control line S4, and the sixth control line S6. Thus, the second switch transistor T2, the fourth switch transistor T4, the fifth switch transistor T5 and the sixth switch transistor T6 may be switched off. Then, a data voltage "Vdata" may be written into the control gate of the driving transistor TP through the data line "data". Thus, the driving transistor TP may be at a saturated switch on state. In one embodiment, the driving transistor TP is a P-type TFT. Thus, the threshold voltage "Vth" of the driving transistor TP may be smaller than zero. Thus, the first terminal of the driving transistor TP may be charged until the voltage on the first terminal of the driving transistor TP is equal to Vdata-Vth. At the same time, because the fifth switch transistor T5 may be switched off, the OLED is at the "off" condition and not to emit light.

As shown in FIG. 3, during the "t6" time slot (corresponding to the light emitting stage), switch on control signals may be applied on the second control line S2 and the fourth control line S4. Thus, the second switch transistor T2 and the fifth switch transistor T5 may be switched on. Close control signals may be applied on the first control line S1, the third control line S3, the fifth control line S5 and the sixth control line S6. Thus, the first switch transistor T1, the third switch transistor T3, the fourth switch transistor T4 and the sixth switch transistor T6 may be switched off. Because the second switch transistor T2 may be switched on, the voltage on the third node "N3" connecting with the storage capacitor C1 may be the first voltage VDD. The first voltage VDD may be provided on the first node "N1". That is, the control gate of the driving transistor TP may be switched on; and the OLED is turned on to emit light.

Further, the voltage on the first terminal of the driving transistor TP may be charged to Vdata−Vth. Thus, the turn-on current of the OLED may be: $I=K(Vgs-Vth)^2=K(VDD-(Vdata-Vth)-Vth)^2=K(VDD-Vdata)^2$. Wherein K is a constant related to the process parameters and the geometric parameters of the first switch transistor T1. Thus, the turn-on current of the OLED may be independent of the threshold voltage "Vth" of the driving transistor TP. Therefore, the effect of the threshold voltage "Vth" of the driving transistor TP to the brightness of the OLED may be eliminated; and the brightness uniformity of the OLED may be improved.

During subsequent time slots, all the control signals may be kept same as those of the "t6" time slot. Thus, the OLED may keep emitting light until a certain time slot in which a switch on control signal is applied on the first control line S1.

The above described timing sequence is explained based on the pixel circuit having the touch control module 2 including the variable capacitor C2 and the sixth switch transistor T6. In certain other embodiments, as shown in the FIG. 2, the variable capacitor C2 may be substituted with the photosensitive diode D1. The timing sequence of the pixel circuit driving method with the photosensitive diode D1 may be the same as the variable capacitor C2.

Thus, according to the disclosed embodiments, the disclosed pixel circuit may be able to realize both the in-cell touch function and the function of compensating the threshold voltage of the driving transistor, i.e., to integrate the in-cell touch function and the function of compensating the threshold voltage of the driving transistor. Thus, the display effect of the AMOLED display having such pixel circuits may be enhanced and less number of transistors and capacitors may be needed, reducing the production cost.

Correspondingly, the present disclosure also provides an array substrate. The array substrate includes the disclosed pixel circuits. Because the array substrate includes the disclosed pixel circuits, the array substrate can implement the in-cell touch function as well as the function for compensating the threshold voltage of the driving transistors. Thus, the practicability of the array substrate may be increased.

Figure 4:
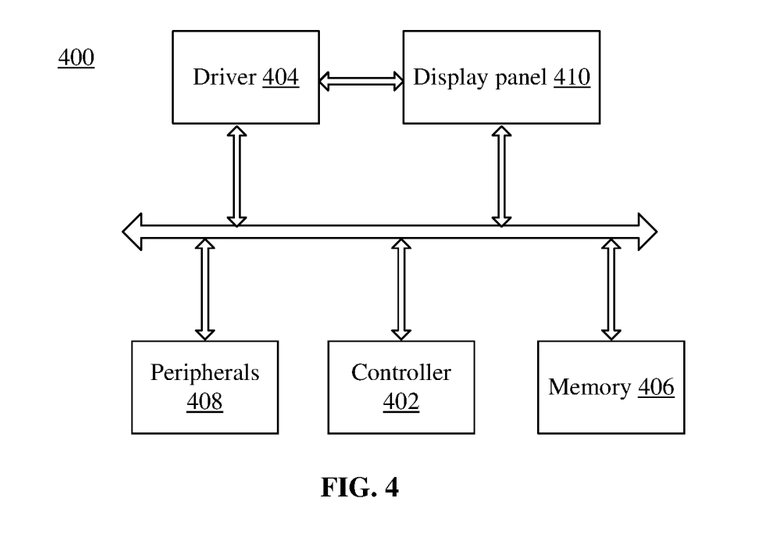
FIG. 4 illustrates a block diagram of an exemplary display apparatus according to the disclosed embodiments.

Correspondingly, the present disclosure also provides a display apparatus. FIG. 4 illustrates an exemplary display apparatus 400 incorporating the disclosed array substrate and other aspects of the present disclosure. The display device 400 may be any appropriate device or component with certain display function. As shown in FIG. 4, the display apparatus 400 includes a controller 402, a driver circuit 404, a memory 406, peripherals 408, and a display panel 410. Certain devices may be omitted and other devices may be included.

The controller 402 may include any appropriate processor or processors. Further, the controller 402 can include multiple cores for multi-thread or parallel processing. The memory 406 may include any appropriate memory modules. The memory 406 may store computer programs for implementing various processes, when executed by the controller 402.

Peripherals 408 may include any interface devices for providing various signal interfaces, Peripherals 408 may also include any appropriate communication module for establishing connections through wired or wireless communication networks.

The driver circuitry 404 may include any appropriate driving circuits to drive the display panel 410. The display panel 410 may include any appropriate flat panel display. In certain embodiments, the display panel 410 may include an AMOLED panel with the disclosed array substrate having the pixel circuits. During operation, the display 410 may be provided with image signals by the controller 402 and the driver circuit 404 for display. Because the display apparatus includes the disclosed array substrate, the display effect may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:
1. A pixel circuit, comprising:
a driving transistor; and
a touch circuit configured to cause a voltage change when a touch operation happens and coupled to a data line through a writing compensation circuit,
wherein the writing compensation circuit includes a storage capacitor, is configured to compensate a threshold voltage of the driving transistor, and to allow the voltage change to be read out through the data line,
the writing compensation circuit further includes a pulling-down sub-circuit for pulling down the voltage of a second terminal of the storage capacitor, and the pulling-down sub- circuit includes a pulling-down switch transistor;
a first terminal of the pulling-down switch transistor is connected to a pulling-down voltage source;
a second terminal of the pulling-down switch transistor is connected to the second terminal of the storage capacitor; and a control gate terminal of the pulling-down switch transistor is connected to a pulling-down control line.

2. The pixel circuit according to claim 1, wherein the writing compensation circuit further includes:
a pulling-up sub-circuit for pulling up the voltage of a first terminal of the storage capacitor,
and
a connecting sub-circuit for allowing the voltage of the first terminal of the storage capacitor to be applied to a control gate of the driving transistor.

3. The pixel circuit according to claim 2, wherein:
the pulling-up sub-circuit includes a pulling-up switch transistor;
a first terminal of the pulling-up switch transistor is connected to a pulling-up voltage source;
a second terminal of the pulling-up switch transistor is connected to the first terminal of the storage capacitor; and
a control gate terminal of the pulling-up switch transistor is connected to a pulling-up control line.

4. The pixel circuit according to claim 2, wherein:
the driving transistor further includes a first terminal being connected to a driving voltage source for driving the light emitting module.

5. The pixel circuit according to claim 1, wherein:
the touch circuit includes a touch sensing element and a touch switch transistor; and
the touch switch transistor includes a first terminal being connected to the first terminal of the storage capacitor, a second terminal being connected to a first terminal of the touch sensing element, and a control gate terminal being connected to a touch sensing control line.

6. The pixel circuit according to claim 5, wherein:
the touch sensing element is a variable capacitor; and
a second terminal of the variable capacitor is floating.

7. The pixel circuit according to claim 5, wherein:
the touch sensing element is a photosensitive diode; and
a first terminal of the photosensitive diode is connected to a terminal with low potential.

8. The pixel circuit according to claim 1, wherein:
the pixel circuit further includes a first data connecting switch transistor; and
the data connecting switch transistor includes a first terminal being connected to the data line, a second terminal being connected to the control gate terminal of the driving transistor, and a control gate terminal being connected to a first data connecting control line.

9. The pixel circuit according to claim 1, wherein:
the pixel circuit further includes a light-emitting module comprising a light emitting switch transistor and an organic light-emitting diode as a pixel of the pixel circuit;
the light-emitting switch transistor includes a first terminal being connected to a second terminal of the driving transistor, a second terminal being connected to a first terminal of the organic light-emitting diode, and a control gate terminal being connected to a light emitting control line; and
a second terminal of the organic light-emitting diode is connected to a pulling-down voltage source.

10. A pixel circuit driving method for a pixel circuit according to claim 1, the pixel circuit driving method comprising:
implementing an initialization stage;
implementing a touch sensing stage;
implementing a touch sensing readout stage;
implementing a resetting stage;
implementing a writing compensation stage; and
implementing a light emitting stage.

11. The pixel circuit driving method according to claim 10, wherein implementing the initialization stage includes:
charging the storage capacitor to make voltage of a first terminal of the storage capacitor be equal to a pulling-up voltage, and voltage of a second terminal of the storage capacitor be equal to a pulling-down voltage.

12. The pixel circuit driving method according to claim 10, wherein implementing the touch sensing stage includes:
changing voltage on a first terminal of the storage capacitor by the touch circuit when the touch operation happens.

13. The pixel circuit driving method according to claim 10, wherein implementing the touch sensing readout stage includes:
reading voltage on a first terminal of the storage capacitor by the data line.

14. The pixel circuit driving method according to claim 10, wherein implementing the resetting stage includes:
charging the storage capacitor to make voltage of a first terminal of the storage capacitor be equal to a pulling-up voltage, and voltage of a second terminal of the storage capacitor be equal to a pulling-down voltage.

15. The pixel circuit driving method according to claim 10, wherein implementing the writing compensation stage includes:
writing a data voltage into the data line;
writing the data voltage into the control gate of the driving transistor to turn on the driving transistor; and
charging the storage capacitor until the voltage of a second terminal of the storage capacitor is equal to a deviation between the data voltage and the threshold voltage of the control gate of the driving transistor.

16. The pixel circuit driving method according to claim 10, wherein implementing the light emitting stage includes:
emitting lights through the light emitting module driven by the driving transistor without disturbance of the threshold voltage.

17. An array substrate comprising the pixel circuit according to claim 1.

18. A display apparatus comprising the array substrate according to claim 17.

* * * * *